United States Patent
Park

(10) Patent No.: US 10,926,694 B2
(45) Date of Patent: Feb. 23, 2021

(54) BRAKING APPARATUS AND METHOD FOR VEHICLE

(71) Applicant: HYUNDAI MOBIS CO., LTD., Seoul (KR)

(72) Inventor: Jae Hyun Park, Yongin-si (KR)

(73) Assignee: HYUNDAI MOBIS CO., LTD., Seoul (KR)

( * ) Notice: Subject to any disclaimer, the term of this patent is extended or adjusted under 35 U.S.C. 154(b) by 0 days.

(21) Appl. No.: 16/521,931

(22) Filed: Jul. 25, 2019

(65) Prior Publication Data

US 2020/0055445 A1  Feb. 20, 2020

(30) Foreign Application Priority Data

Aug. 16, 2018 (KR) .......... 10-2018-0095215

(51) Int. Cl.
*B60Q 1/44* (2006.01)
*B60T 7/04* (2006.01)
*B60T 13/74* (2006.01)
*H03K 7/08* (2006.01)

(52) U.S. Cl.
CPC .............. *B60Q 1/441* (2013.01); *B60T 7/042* (2013.01); *B60T 13/74* (2013.01); *H03K 7/08* (2013.01)

(58) Field of Classification Search
CPC ....... B60Q 1/441; B60T 13/74; B60T 13/662; B60T 7/042; B60T 7/06; B60T 2220/04; B60T 17/22; B60T 8/3255; B60T 8/17; H03K 7/08; H03K 4/066
USPC .................. 340/426.32, 453, 479; 701/70
See application file for complete search history.

(56) References Cited

U.S. PATENT DOCUMENTS

| | | | | |
|---|---|---|---|---|
| 5,150,098 | A * | 9/1992 | Rakow | B60Q 1/444 340/464 |
| 6,179,390 | B1 * | 1/2001 | Guzorek | B60T 7/042 188/3 R |
| 7,755,474 | B2 * | 7/2010 | Singh | B60Q 1/444 340/479 |
| 9,643,534 | B1 * | 5/2017 | Zharichenko | B60Q 1/447 |
| 2003/0048182 | A1 * | 3/2003 | Fulks | B60T 7/042 340/479 |
| 2007/0279207 | A1 * | 12/2007 | Clark | B60Q 1/441 340/479 |
| 2007/0284160 | A1 * | 12/2007 | Loring | B60T 1/10 180/65.1 |
| 2008/0257656 | A1 * | 10/2008 | Skinner | B60T 13/662 188/1.11 E |

(Continued)

FOREIGN PATENT DOCUMENTS

KR  10-2008-0008900 A  1/2008

*Primary Examiner* — Adnan Aziz
(74) *Attorney, Agent, or Firm* — Knobbe Martens Olson & Bear LLP

(57) ABSTRACT

A braking apparatus for a vehicle may include: a pedal stroke sensing unit configured to sense a pedal stroke of a brake pedal, and output a pedal stroke signal; and a control unit configured to control a brake actuator for braking the vehicle, based on the pedal stroke signal inputted from the pedal stroke sensing unit, and output a ramp signal in which information on whether a braking action of the vehicle has been performed is reflected, based on a reference voltage signal which is preset to determine whether the brake pedal is stepped on and a voltage signal converted from the pedal stroke signal.

14 Claims, 3 Drawing Sheets

(56) References Cited

U.S. PATENT DOCUMENTS

| | | | |
|---|---|---|---|
| 2011/0160970 A1* | 6/2011 | Crombez | B60T 8/4077 |
| | | | 701/70 |
| 2011/0320099 A1* | 12/2011 | Kim | B60T 8/885 |
| | | | 701/70 |
| 2012/0323430 A1* | 12/2012 | Nakamura | B60L 11/1803 |
| | | | 701/22 |
| 2013/0096810 A1* | 4/2013 | Correia | B60W 10/08 |
| | | | 701/112 |
| 2014/0067221 A1* | 3/2014 | Sundaram | B60T 7/107 |
| | | | 701/70 |
| 2014/0139333 A1* | 5/2014 | Burgdorf | B60T 7/042 |
| | | | 340/479 |
| 2014/0305751 A1* | 10/2014 | Yamamoto | B60T 8/4081 |
| | | | 188/72.4 |
| 2015/0081184 A1* | 3/2015 | Braunberger | B60T 7/20 |
| | | | 701/70 |
| 2015/0344014 A1* | 12/2015 | Knechtges | B60T 13/745 |
| | | | 701/70 |
| 2016/0159328 A1* | 6/2016 | Georgin | B60T 8/17 |
| | | | 701/70 |
| 2017/0221281 A1* | 8/2017 | Hecht | B60T 8/885 |
| 2017/0313198 A1* | 11/2017 | Yamada | H02P 6/16 |
| 2018/0105156 A1* | 4/2018 | Kishi | B60T 8/4077 |
| 2019/0003536 A1* | 1/2019 | Yasui | F16D 65/183 |

* cited by examiner

BRAKING APPARATUS AND METHOD FOR VEHICLE

CROSS-REFERENCES TO RELATED APPLICATIONS

The present application claims priority to Korean application number 10-2018-0095215, filed on Aug. 16, 2018, which is incorporated by reference in its entirety.

BACKGROUND OF THE INVENTION

The present invention relates to a braking apparatus and method for a vehicle, and more particularly, to a braking apparatus and method for a vehicle, which can control a brake actuator and a brake lamp of a vehicle.

Recently, an electric booster brake system has spread to implement a vacuum-free brake system for improving fuel efficiency and to implement regenerative brake cooperation control of an electric vehicle and an active brake actuator such as an autonomous emergency braking system (AEB).

In general, the electric booster brake system maintains most of the brake mechanism of an existing vacuum booster brake system, but has a difference in boosting mechanism from the vacuum booster brake system in that the electric booster brake system boosts braking hydraulic pressure through the force of an electric booster using electric energy, i.e. a motor, instead of boosting braking hydraulic pressure through a pressure difference between pneumatic pressure and vacuum pressure like the vacuum booster brake system.

Separately from the braking mechanism of the electric booster brake system, a function of turning on a brake lamp (e.g. taillight) to notify a braking action of the vehicle to the outside is applied to the vehicle, when a driver steps on the brake pedal of a vehicle. For this function, a BLS (Brake Light Switch) whose contact is opened/closed as the driver steps on/off the brake pedal is applied to the brake system.

Recently, electric drive vehicles such as an EV (Electric Vehicle), PHEV (Plug-in Hybrid Electric Vehicle) and HEV (Hybrid Electric Vehicle) have become common, and a regenerative brake system has been developed. Thus, the application of the electric booster brake system such as iMEB or VEB in an existing CBS (Conventional Brake System) has increased. In order to follow such a trend, a pedal stroke sensor for sensing a pedal stroke of a brake pedal and a BLS mounted on the brake pedal are required to be replaced and merged. That is, since the existing BLS is implemented as a mechanical switch, the BLS may generate operating noise. Furthermore, since the pedal stroke sensor and the BLS are configured as separate modules, a wire harness and a PCB (Printed Circuit Board) are doubly applied, thereby increasing the manufacturing cost.

The related art of the present invention is disclosed in Korean Patent Application Laid-Open No. 10-2008-0008900 published on Jan. 24, 2008.

SUMMARY OF THE INVENTION

Embodiments of the present invention are directed to a braking apparatus and method for a vehicle, which can solve the problems such as an occurrence of operating noise and an increase in manufacturing cost which are caused by the configuration in which a pedal stroke sensor and a BLS are installed as separate modules.

In one embodiment, a braking apparatus for a vehicle may include: a pedal stroke sensing unit configured to sense a pedal stroke of a brake pedal, and output a pedal stroke signal; and a control unit configured to control a brake actuator for braking the vehicle, based on the pedal stroke signal inputted from the pedal stroke sensing unit, and output a ramp signal in which information on whether a braking action of the vehicle has been performed is reflected, based on a reference voltage signal which is preset to determine whether the brake pedal is stepped on and a voltage signal converted from the pedal stroke signal.

The pedal stroke sensing unit may output the pedal stroke signal as a PWM (Pulse Width Modulation) signal.

The control unit may include: an integration circuit configured to generate the converted voltage signal by integrating the pedal stroke signal outputted as the PWM signal; and a comparison circuit configured to compare the converted voltage signal and the reference voltage signal and output the ramp signal.

The reference voltage signal may be preset in consideration of the pedal stroke signal outputted from the pedal stroke sensing unit in a state where the brake pedal is not stepped on and the pedal stroke signal outputted from the pedal stroke sensing unit in a state where the brake pedal is stepped on to the maximum.

The control unit may compare the reference voltage signal and the converted voltage signal through the comparison circuit, and change the ramp signal according to the converted voltage signal and output the changed ramp signal.

The braking apparatus may further include a brake lamp configured to be turned on/off by control of the ramp signal outputted from the control unit.

In another embodiment, a braking method for a vehicle may include: outputting, by a pedal stroke sensing unit, a pedal stroke signal by sensing a pedal stroke of a brake pedal; controlling, by a control unit, a brake actuator for braking the vehicle, based on the pedal stroke signal inputted from the pedal stroke sensing unit; and outputting, by the control unit, a ramp signal into which information on whether a braking action of the vehicle has been performed is reflected, based on a reference voltage signal which is preset to determine whether the brake pedal is stepped on and a voltage signal converted from the pedal stroke signal.

In accordance with the embodiment of the present invention, the function of the conventional BLS may be implemented in a circuit manner through the configuration in which the braking of the vehicle and the turn-on/off of the brake lamp are implemented together based on the output signal from the pedal stroke sensor, which makes it possible to not only remove operating noise of the BLS implemented as a mechanical switch, but also reduce the manufacturing cost of the vehicle.

DESCRIPTION OF SPECIFIC EMBODIMENTS

Hereafter, a braking apparatus and method for a vehicle in accordance with an embodiment of the present invention will be described in detail with reference to the accompanying drawings. It should be noted that the drawings are not to precise scale and may be exaggerated in thickness of lines or sizes of components for descriptive convenience and clarity only. Furthermore, the terms as used herein are defined by taking functions of the invention into account and can be changed according to the custom or intention of users or operators. Therefore, definition of the terms should be made according to the overall disclosures set forth herein.

Figure 1:
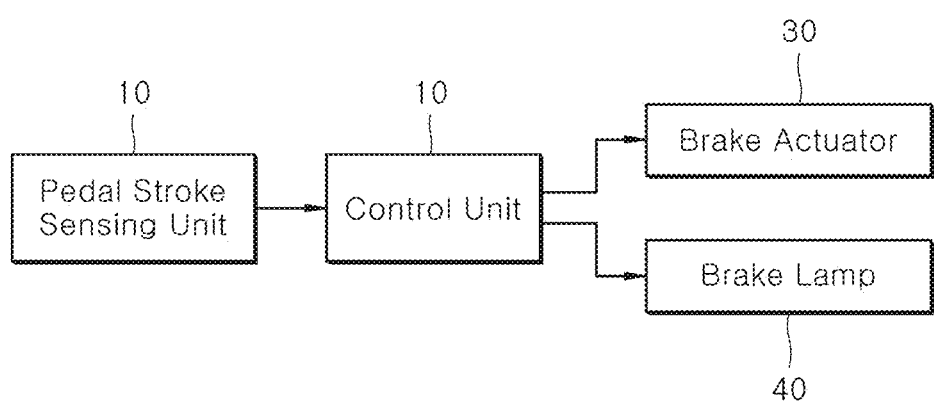
FIG. 1 is a block diagram illustrating a braking apparatus for a vehicle in accordance with an embodiment of the present invention.
Figure 2:
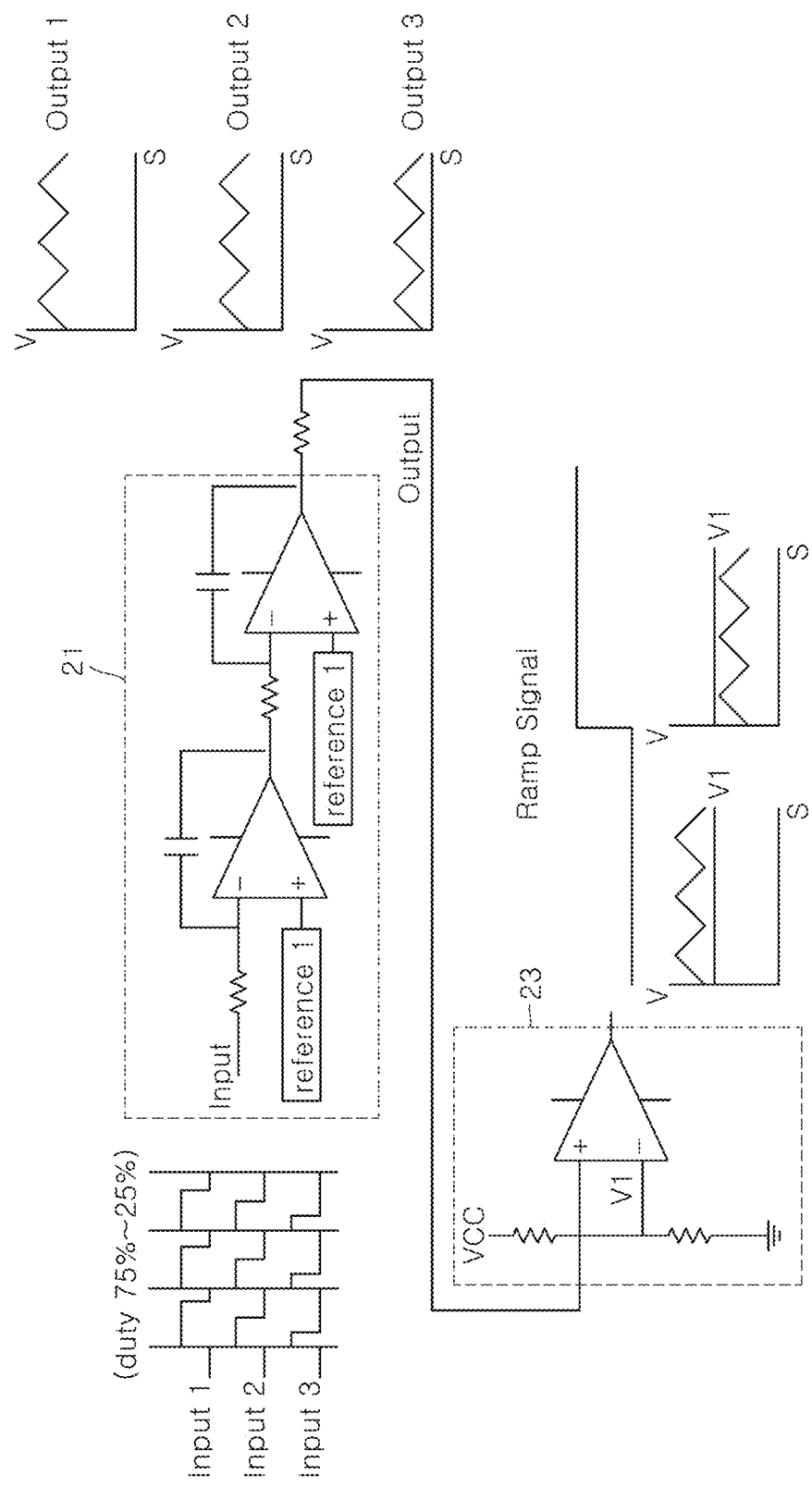
FIG. 2 is a circuit diagram illustrating a detailed circuit configuration of a control unit in the braking apparatus for a vehicle in accordance with the embodiment of the present invention.

FIG. 1 is a block diagram illustrating a braking apparatus for a vehicle in accordance with an embodiment of the present invention, and FIG. 2 is a circuit diagram illustrating a detailed circuit configuration of a control unit in the braking apparatus for a vehicle in accordance with the embodiment of the present invention.

Referring to FIG. 1, the braking apparatus for a vehicle in accordance with the embodiment of the present invention may include a pedal stroke sensing unit 10, a control unit 20, a brake actuator 30 and a brake lamp 40.

The pedal stroke sensing unit 10 may sense a pedal stroke of a brake pedal, which is formed as a driver steps on the brake pedal, and output a pedal stroke signal to the control unit 20 which will be described below. The pedal stroke sensing unit 10 may be implemented as a pedal stroke sensor that senses a swing angle of a pedal arm based on a zero point, and outputs the pedal stroke signal as a PWM (Pulse Width Modulation) signal based on the sensing result.

The pedal stroke sensing unit 10 which can be implemented as a pedal stroke sensor may output the pedal stroke signal as a PWM signal having the maximum duty ratio of 75%, for example, when the brake pedal is not stepped on (Input 1 of FIG. 2). As the driver gradually steps on the brake pedal, the duty ratio of the pedal stroke signal may be reduced (Input 2 of FIG. 2). When the brake pedal is stepped on to the maximum (full-stroke), the pedal stroke sensing unit 10 may output the pedal stroke signal as a PWM signal having the minimum duty ratio of 25%, for example (Input 3 of FIG. 2). The pedal stroke signal which is outputted at a different ratio depending on whether the brake pedal is stepped on may be considered to decide a reference voltage signal which will be described below.

The brake actuator 30 may be implemented as an electric booster (motor) and controlled by the control unit 20. The brake actuator 30 may move a piston of a master cylinder to form braking hydraulic pressure, thereby braking the vehicle. As the braking hydraulic pressure formed by the master cylinder is transferred to a wheel cylinder installed on a wheel, friction braking may be performed by a braking apparatus such as a brake caliper.

The brake lamp 40 may perform a function of notifying a braking action of the vehicle to the outside, while the turn-on/off of the brake lamp 40 is controlled by a ramp signal outputted from the control unit 20 as will be described below. The brake lamp 40 may be implemented as a stop lamp for helping a driver of a following vehicle to recognize the braking action of the ego vehicle.

The control unit 20 may control the brake actuator 30 for braking the vehicle, based on the pedal stroke signal inputted from the pedal stroke sensing unit 10, and output the ramp signal into which information on whether the braking action of the vehicle has been performed is reflected, based on a reference voltage signal which is preset to determine whether the brake pedal is stepped on and a voltage signal converted from the pedal stroke signal. The control unit 20 may be implemented as an ECU (Electronic Control Unit) for controlling the braking action of the vehicle.

That is, the braking apparatus in accordance with the present embodiment may employ the configuration in which a conventional BLS implemented as a mechanical switch is removed, and the brake actuator 30 and the brake lamp 40 are controlled together by the pedal stroke signal. Hereafter, the configuration of the braking apparatus in accordance with the present embodiment, which controls the brake lamp 40 based on the pedal stroke signal, will be described in detail based on the circuit configuration of the control unit 20 to output the ramp signal.

As illustrated in FIG. 2, the control unit 20 may include an integration circuit 21 and a comparison circuit 23. The integration circuit 21 may generate the converted voltage signal Output by integrating the pedal stroke signal Input outputted as a PWM signal, and the comparison circuit 23 may compare the converted voltage signal to the reference voltage signal V1 and output the ramp signal.

Specifically, the control unit 20 may generate the converted voltage signal by integrating the pedal stroke signal outputted as a PWM signal through the integration circuit 21. The pedal stroke signal may be linearly smoothed through the integration circuit 21, and converted into the converted voltage signal having a sawtooth wave. The generation of the converted voltage signal having a sawtooth wave through the integration circuit 21 may be performed as a preliminary step for comparison between the converted voltage signal and the reference voltage signal through the comparison circuit 23 which will be described below. FIG. 2 illustrates the converted voltage signals Output 1, 2 and 3 which are generated according to the duty ratios of the pedal stroke signals Input 1, 2 and 3, respectively.

The integration circuit 21 may be configured as a circuit in which a plurality of integrators each including an operational amplifier, a resistor and a capacitor are cascade-connected as illustrated in FIG. 2, and the resistance values of the resistors included in the respective integrators and the capacitances of the capacitors included in the respective integrators may be designed in various manners based on a designer's intention and experimental results.

After the pedal stroke signal is converted into the converted voltage signal, the control unit 20 may compare the converted voltage signal and the reference voltage signal through the comparison circuit 23, and output the ramp signal into which information on whether a braking action of the vehicle has been performed is reflected.

The reference voltage signal may be preset in the control unit 20 in consideration of the pedal stroke signal which is outputted from the pedal stroke sensing unit 10 in a state where the brake pedal is not stepped on and the pedal stroke signal which is outputted from the pedal stroke sensing unit 10 in a state where the brake pedal is stepped on to the maximum.

Specifically, the pedal stroke sensing unit 10 may output the pedal stroke signal as a PWM signal having the maximum duty ratio of 75%, for example, when the brake pedal is not stepped on. As the brake pedal is gradually stepped on by the driver, the duty ratio of the pedal stroke signal may be reduced. When the brake pedal is stepped on to the maximum (full-stroke), the pedal stroke sensing unit 10 may output the pedal stroke signal as a PWM signal having the minimum duty ratio of 25%. Thus, a signal having a voltage corresponding to a specific duty ratio (e.g. 73%) between the maximum duty ratio (e.g. 25%) and the maximum duty ratio (e.g. 75%) of the pedal storage signal may be set to the reference voltage signal. For example, a voltage signal having the average voltage value of the maximum voltage value and the minimum voltage value of the converted voltage signal having a sawtooth wave, which is generated when the pedal stroke signal having the specific duty ratio of 73% is passed through the above-described integration circuit 21, may be set to the reference voltage signal.

Therefore, the control unit 20 may compare the converted voltage signal and the reference voltage signal through the comparison circuit 23 and output the ramp signal. When the magnitude of the converted voltage signal exceeds the magnitude of the reference voltage signal in the whole time period, the control unit 20 may determine that the driver does not step on the brake pedal, and output the ramp signal having a low-level voltage. When the magnitude of the converted voltage signal is less than the magnitude of the reference voltage signal in the whole time period or the converted voltage signal and the reference voltage signal overlap each other, the control unit 20 may determine that the driver is stepping on the brake pedal, and output the ramp signal having a high-level voltage That is, the control unit 20 may compare the reference voltage signal and the converted voltage signal through the comparison circuit 23, and change the ramp signal according to the converted voltage signal and output the changed ramp signal. FIG. 2 illustrates the case in which the ramp signal having a low-level voltage is outputted because the magnitude of the converted voltage signal exceeds the magnitude of the reference voltage signal in the whole time period, and the case in which the ramp signal having a high-level voltage is outputted because the magnitude of the converted voltage signal is less than the magnitude of the reference voltage signal in the whole time period.

Considering that the minimum duty ratio of 25% and the maximum duty ratio of 75%, which have been described above, may be differently set depending on a mounting tolerance such as a mounting position of the pedal stroke sensor in each vehicle, the reference voltage signal in an installation step may be configured as a tuning parameter. The comparison circuit 23 may include a plurality of resistors and comparators for voltage division as illustrated in FIG. 2, and the resistance value of each of the resistors may be set to a proper value to generate the reference voltage signal through voltage division.

In accordance with the above-described configuration, when the ramp signal having a low-level voltage is outputted from the control unit 20, the brake lamp 40 may not be turned on, and when the ramp signal having a high-level voltage is outputted, the brake lamp 40 may be turned on to inform the following vehicle of the braking action of the ego vehicle.

The above descriptions have been focused on the configuration in which the control unit 20 generates the ramp signal based on the pedal stroke received from the pedal stroke sensing unit 10, and controls the turn on/off of the brake lamp 40. Furthermore, even when autonomous braking such as AEB (Autonomous Emergency Braking) is performed with no pedal stroke signal instead of a braking operation performed by a driver who steps on the brake pedal, the control unit 20 may output the ramp signal according to the logic thereof, and control the turn-on of the brake lamp 40.

Figure 3:
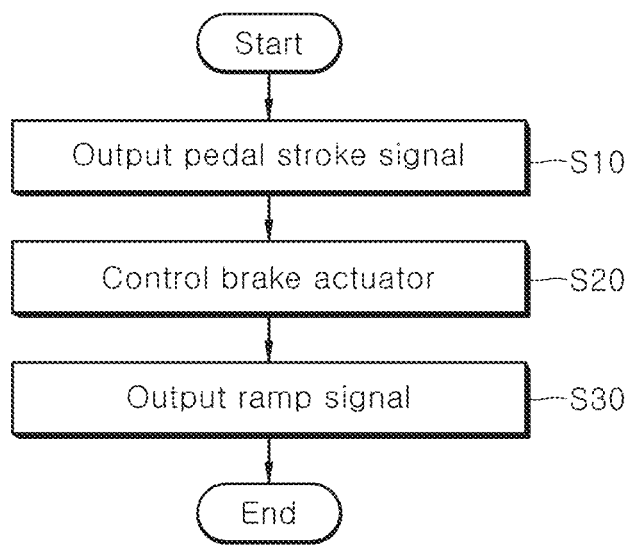
FIG. 3 is a flowchart for describing a braking method for a vehicle in accordance with an embodiment of the present invention.

FIG. 3 is a flowchart for describing a braking method for a vehicle in accordance with an embodiment of the present invention.

Referring to FIG. 3, the braking method for a vehicle in accordance with the embodiment of the present invention may begin with step S10 in which the pedal stroke sensing unit 10 senses a pedal stroke of the brake pedal and outputs a pedal stroke signal. In step S10, the pedal stroke sensing unit 10 may output the pedal stroke signal as a PWM signal.

Then, the control unit 20 may control the brake actuator 30 for braking the vehicle, based on the pedal stroke signal inputted from the pedal stroke sensing unit 10, in step S20. That is, the control unit 20 may calculate a required braking force based on the pedal stroke signal, and drive the brake actuator 30 to move the piston of the master cylinder, thereby forming braking hydraulic pressure according to the required braking force. The braking hydraulic pressure formed by the master cylinder may be transferred to the wheel cylinder installed on the wheel, such that friction braking can be performed by a braking apparatus such as a brake caliper.

Independently of step S20, the control unit 20 may output a ramp signal into which information on whether a braking action of the vehicle has been performed is reflected, based on the reference voltage signal which is preset to determine whether the brake pedal is stepped on and the voltage signal converted from the pedal stroke signal, in step S30.

In step S30, the control unit 20 may generate the converted voltage signal by integrating the pedal stroke signal outputted as a PWM signal, and compare the converted voltage signal and the reference voltage signal and output the ramp signal. As described above, the reference voltage signal may be preset in the control unit 20 in consideration of the pedal stroke signal outputted from the pedal stroke sensing unit 10 in a state where the brake pedal is not stepped on and the pedal stroke signal outputted from the pedal stroke sensing unit 10 in a state where the brake pedal is stepped on to the maximum. Thus, the control unit 20 may compare the reference voltage signal and the converted voltage signal, and change the ramp signal according to the converted voltage signal and output the changed ramp signal.

When the ramp signal having a low-level voltage is outputted from the control unit 20, the brake lamp 40 may not be turned on, and when the ramp signal having a high-level voltage is outputted, the brake lamp 40 may be turned on to inform the following vehicle of the braking action of the ego vehicle.

In accordance with the embodiment of the present invention, the function of the conventional BLS may be implemented in a circuit manner through the configuration in which the braking of the vehicle and the turn-on/off of the brake lamp are implemented together based on the output signal from the pedal stroke sensor, which makes it possible to not only remove operating noise of the BLS implemented as a mechanical switch, but also reduce the manufacturing cost of the vehicle.

Although preferred embodiments of the invention have been disclosed for illustrative purposes, those skilled in the art will appreciate that various modifications, additions and substitutions are possible, without departing from the scope and spirit of the invention as defined in the accompanying claims.

What is claimed is:

1. A braking apparatus for a vehicle, comprising:
   a pedal stroke sensing unit configured to sense a pedal stroke of a brake pedal, and output a pedal stroke signal; and
   a control unit configured to:
      calculate a braking force based on the pedal stroke signal inputted from the pedal stroke sensing unit,
      drive a brake actuator of the vehicle according to the calculated braking force, generate a voltage signal based on the pedal stroke signal inputted from the pedal stroke sensing unit, determine that the brake pedal is stepped on based on a comparison of the generated voltage signal to a reference voltage signal, and output, based on the determination that the brake pedal is stepped on, a ramp signal to a brake lamp of the vehicle to cause the brake lamp to be turned on, wherein the brake lamp is configured to indicate a braking action of the vehicle, wherein the control unit is configured to use the pedal stroke signal inputted from the pedal stroke sensing unit both (i) to calculate the braking force according to which the brake actuator is to be driven and (ii) to output the ramp signal for turning on the brake lamp.

2. The braking apparatus of claim 1, wherein the pedal stroke sensing unit is configured to output the pedal stroke signal as a PWM (Pulse Width Modulation) signal.

3. The braking apparatus of claim 2, wherein the control unit comprises:
an integration circuit configured to generate the voltage signal by integrating the pedal stroke signal outputted as the PWM signal; and
a comparison circuit configured to compare the voltage signal and the reference voltage signal and output the ramp signal.

4. The braking apparatus of claim 3, wherein the reference voltage signal is preset in consideration of a first pedal stroke signal outputted from the pedal stroke sensing unit in a state where the brake pedal is not stepped on and a second pedal stroke signal outputted from the pedal stroke sensing unit in a state where the brake pedal is stepped on to a maximum.

5. The braking apparatus of claim 4, wherein the control unit is configured to compare the reference voltage signal and another voltage signal through the comparison circuit, change the ramp signal according to said another voltage signal, and output the changed ramp signal.

6. The braking apparatus of claim 1, further comprising a brake lamp configured to be turned on/off based on the ramp signal outputted from the control unit.

7. The braking apparatus of claim 1, wherein the control unit is configured to use the pedal stroke signal inputted from the pedal stroke sensing unit both (i) to calculate the braking force according to which the brake actuator is to be driven and (ii) to generate a sawtooth wave as the voltage signal to be compared to the reference voltage signal.

8. The braking apparatus of claim 1, wherein the pedal stroke signal is associated with a first duty ratio between a maximum duty ratio corresponding to the brake pedal not being stepped on and a minimum duty ratio corresponding to the brake pedal being fully stepped on, and the reference voltage signal is associated with a second duty ratio between the maximum duty ratio and the minimum duty ratio.

9. The braking apparatus of claim 8, wherein the reference voltage signal is an average of (i) a maximum voltage value of a reference sawtooth wave generated based on a reference pedal stroke signal having a reference duty ratio between the maximum duty ratio and the minimum duty ratio and a minimum voltage and (ii) a minimum voltage value of the reference sawtooth wave generated based on the reference pedal stroke signal having the reference duty ratio.

10. A braking method for a vehicle, comprising:
outputting, by a pedal stroke sensing unit, a pedal stroke signal by sensing a pedal stroke of a brake pedal;
calculating, by a control unit, a braking force based on the pedal stroke signal from the pedal stroke sensing unit,
driving, by the control unit, a brake actuator of the vehicle according to the calculated braking force,
generating, by the control unit, a voltage signal based on the pedal stroke signal from the pedal stroke sensing unit,
determining, by the control unit, that the brake pedal is stepped on based on a comparison of the generated voltage signal to a reference voltage signal, and
outputting, by the control unit and based on the determination that the brake pedal is stepped on, a ramp signal to a brake lamp of the vehicle to cause the brake lamp to be turned on, wherein the brake lamp is configured to indicate a braking action of the vehicle,
wherein the control unit uses the pedal stroke signal from the pedal stroke sensing unit both (i) to calculate the braking force according to which the brake actuator is to be driven and (ii) to output the ramp signal for turning on the brake lamp.

11. The braking method of claim 10, wherein in the outputting of the pedal stroke signal, the pedal stroke sensing unit outputs the pedal stroke signal as a PWM (Pulse Width Modulation) signal.

12. The braking method of claim 11, wherein in the outputting of the ramp signal, the control unit is configured to generate the voltage signal by integrating the pedal stroke signal outputted as the PWM signal, compare the voltage signal and the reference voltage signal, and output the ramp signal.

13. The braking method of claim 12, wherein the reference voltage signal is preset in consideration of a first pedal stroke signal outputted from the pedal stroke sensing unit in a state where the brake pedal is not stepped on and a second pedal stroke signal outputted from the pedal stroke sensing unit in a state where the brake pedal is stepped on to a maximum.

14. The braking method of claim 13, wherein subsequent to outputting of the ramp signal, the control unit is configured to compare the reference voltage signal and another voltage signal, change the ramp signal according to said another voltage signal, and output the changed ramp signal.

* * * * *